United States Patent [19]
Inoue et al.

[11] Patent Number: 5,923,084
[45] Date of Patent: Jul. 13, 1999

[54] SEMICONDUCTOR DEVICE FOR HEAT DISCHARGE

[75] Inventors: Kazuaki Inoue; Hiroyuki Yamashita; Norio Nakamura; Hiroyuki Yoda, all of Nagano-ken, Japan

[73] Assignee: Seiko Epson Corporation, Tokyo, Japan

[21] Appl. No.: 08/658,539

[22] Filed: Jun. 5, 1996

[30] Foreign Application Priority Data

Jun. 6, 1995 [JP] Japan ..................... 7-139537
Jun. 4, 1996 [JP] Japan ..................... 8-162518

[51] Int. Cl.⁶ ................................. H01L 23/34
[52] U.S. Cl. .................. 257/712; 257/717; 257/723
[58] Field of Search ......................... 257/212, 717, 257/720, 713, 723, 701, 730

[56] References Cited

U.S. PATENT DOCUMENTS

| | | | |
|---|---|---|---|
| 4,396,936 | 8/1983 | McIver et al. | 257/717 |
| 5,285,352 | 2/1994 | Pastori et al. | 257/712 |
| 5,506,755 | 4/1996 | Miyagi et al. | 257/712 |
| 5,552,635 | 9/1996 | Kim et al. | 257/712 |
| 5,625,227 | 4/1997 | Estes et al. | 257/712 |

FOREIGN PATENT DOCUMENTS

| | | | |
|---|---|---|---|
| A-3-182397 | 8/1991 | Japan . | |
| U-4-7175 | 1/1992 | Japan . | |
| 6163737 | 6/1994 | Japan | 257/712 |

OTHER PUBLICATIONS

Disclosure 26519, Research Disclosure, May 1986, #265; Ken. Mason Pub. Ltd.
Cherniack et al; IBM Tech. Disc. Bull., vol. 8, No. 10, Mar. 1966.
"High Efficiency Radiation Hole With Metal Core Printed Wiring Board," IBM Tech. Disc. Bull.; vol. 33, No. 7; Nov. 1990.

*Primary Examiner*—Olik Chaudhuri
*Assistant Examiner*—Nathan K. Kelley
*Attorney, Agent, or Firm*—Oliff & Berridge, PLC

[57] ABSTRACT

A semiconductor device comprising a low-heat-resistance heat discharging route suitable for small semiconductor devices, such as an IC card, is disclosed. Heat arising from electronic parts is efficiently dispersed to the outside, thereby accomplishing a decrease in size and a heightening of function. In a specific embodiment, a CPU is mounted on a substrate in a position of thermal via holes. A high-heat-conducting material such as semifluid silicone rubber is placed between a CPU mounting face of the substrate and lower panel located on the opposite side of the substrate. The high-heat-conducting material is a filler having the ability to change shape and the property of electrical nonconductivity. A greater part of the heat arising from the CPU is transmitted through the thermal via holes from the CPU mounting face of the substrate to the opposite side, and further to the high-heat-conducting material which conveys the heat to the lower panel. The heat is dispersed from the lower panel surface directly into the atmosphere.

43 Claims, 11 Drawing Sheets

SEMICONDUCTOR DEVICE FOR HEAT DISCHARGE

BACKGROUND OF THE INVENTION

1. Field of the Invention

The invention relates to a heat discharging structure for use with a semiconductor device.

2. Description of Related Art

In general, when electronic parts such as semiconductor elements are operated, heat is generated through the consumption of electric power. When the temperature becomes too high, the functions and characteristics of the electronic parts are impaired, and the product life of the electronic parts is shortened. For example, in the case of a complementary metal oxide semiconductor (CMOS) integrated circuit, when the temperature of the environment or the part itself exceeds a predetermined level, the response speed of the transistor elements drops sharply, and properties such as operational clock frequency and access time are affected.

In order to discharge to the outside the heat arising from the electronic parts, it is common to use methods such as making a slit in the casing of the electronics to allow outside air to enter naturally, and forcing cooling of the inside by using a fan to blow air in or exhaust air out. In addition, in the case of a semiconductor device which produces large amounts of heat, such as a central processing unit (CPU), there have been innovations such as increasing the heat discharging area by installing heat sinks, using heat discharging substrates such as fins, or cooling by installing heat pipes, such as water cooling jackets.

Figure 10:
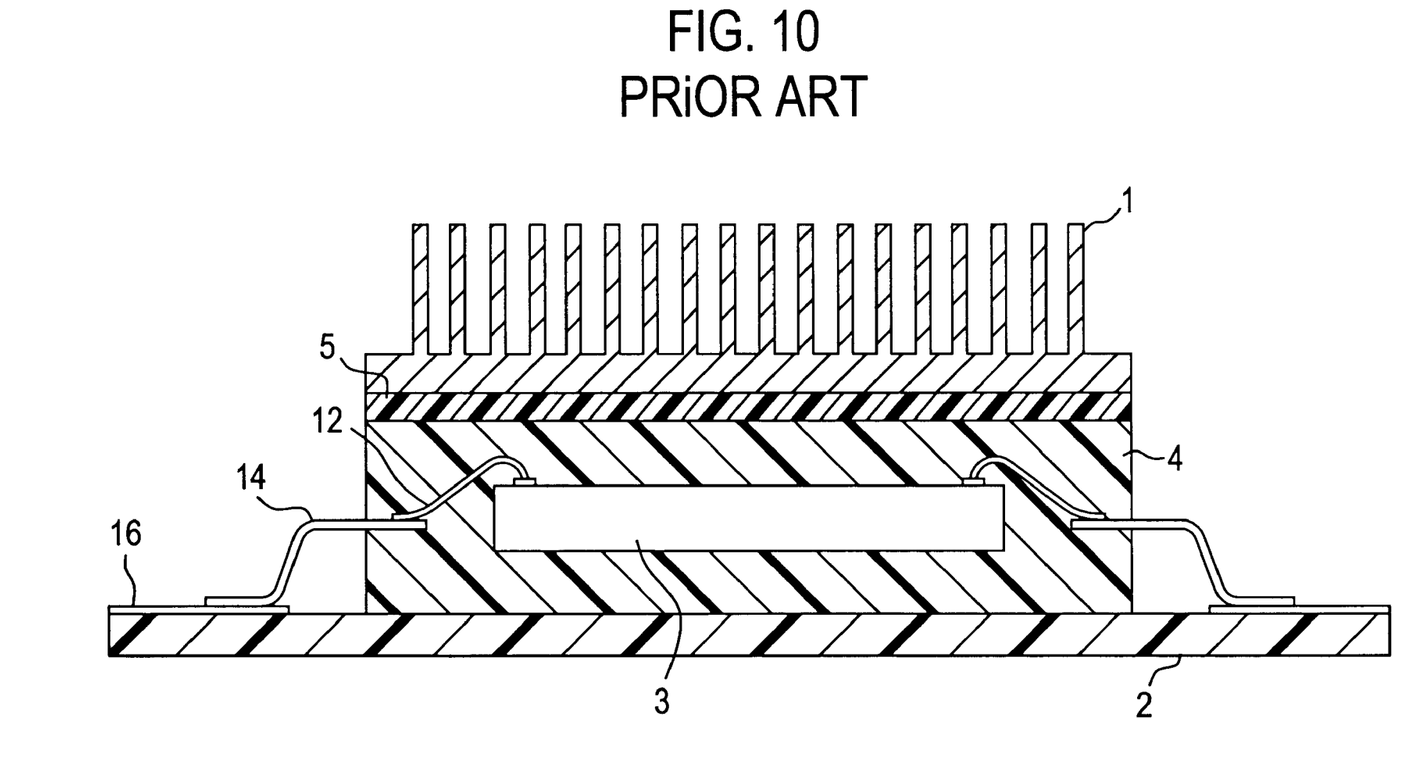
FIG. 10 is a cross-sectional drawing of a prior art heat discharging structure.

For example, as shown in the prior art of FIG. 10, heat discharging fin 1 is attached by means of heat conducting adhesive agent 5 to the upper face of resin package 4 of semiconductor chip 3, which is mounted on circuit board 2. Also, as shown in the small notebook-type computer 6 of the prior art in FIG. 11, the heat discharging substrate 8 inside of case 7 is made so as to connect to the surface of package 11 of CPU 10, mounted on circuit board 9, so that heat from CPU 10, which consumes the most electric power, is conducted to the outside by heat discharging substrate 8, without adversely affecting the properties of the CPU, thus preserving the functions of the computer.

Heat arising from electronic parts can also be released to the outside from the outer lead through the wiring pattern of the circuit board. For example, in the examples of prior art in FIGS. 10 and 11, heat is conducted from respective bonding wires 12 and 13 through respective outer leads 14 and 15 to respective circuit board wiring patterns 16 and 17.

In addition, in the case of surface mounting by wire bonding and chip on board (COB) systems, because the heat conductivity of the bonding material generally used to resin-seal semiconductor parts is low, there is a method known which involves making thermal via holes in the circuit board and discharging heat to the outside from the conductor pattern of the inner layer, for example the ground layer or electronic power supply layer. Also, in a tape carrier package (TCP) system or the COB system mentioned above, the method is also used of decreasing heat production as much as possible by operating the semiconductor element at low voltage and reducing electric current consumption.

On the other hand, in the case of so-called Integrated Circuit (IC) cards, which enclose circuit boards mounted with electronic parts within card-shaped metal-construction cases as explained in Japanese laid-open patent publication number Hei 3-182397, a structure is suggested wherein the semiconductor element, which packages the semiconductor chip, is mounted on the circuit board, and heat arising from the semiconductor element is discharged by passage through a high heat conductive material, which fills the space between the semiconductor element and the external metallic panel, to the outside from the external metallic panel. In addition, in the IC card listed in the specifications for Japanese laid-open utility model publication Hei 4-7175, the effectiveness of heat discharging is heightened by making heat discharging fins on the outside face of the metallic panel.

Because the circulation fans, heat sinks, heat pipes, and other such heat discharging methods of the prior art as explained above increase the size of the device as a whole, they are not well-suited to a small semiconductor device. The heat discharging fins in FIG. 10 are expensive, and, in addition, manufacturing costs are high because of the added assembly steps needed to install them on semiconductor parts.

Further, small-size semiconductors used in portable information equipment such as notebook computers and electronic notebooks have a high probability of receiving shocks to their mechanisms due to being dropped or other incidents of daily use, which may cause the adhesive agent of the heat discharging fins to come off, impairing heat discharging capability and increasing the risk of possible damage to machine functioning due to accumulated internal heat.

Figure 11:
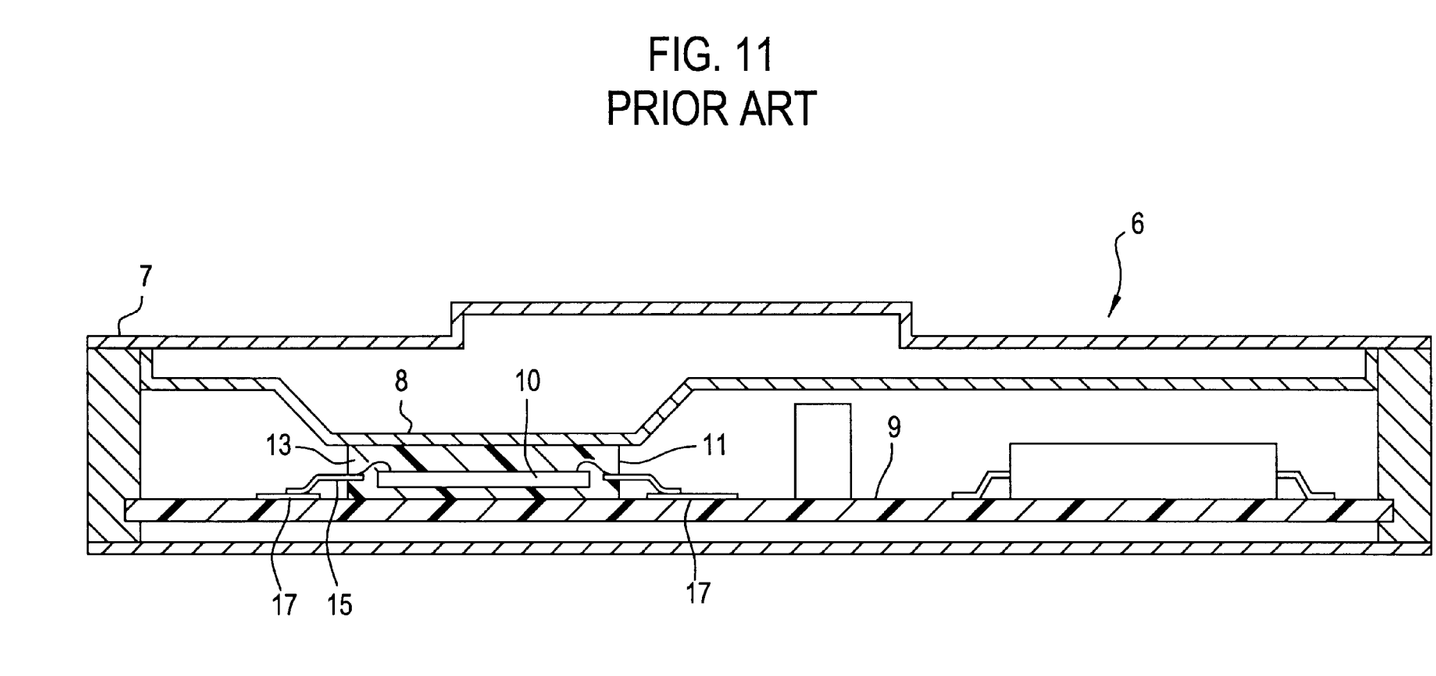
FIG. 11 is a cross-sectional drawing of a prior art notebook-type computer utilizing a heat discharging substrate.

Also, with semiconductor parts such as the CPU 10 shown in FIG. 11, generally the heat resistance is high for the mold resin forming package 11, and it is very thick, being several hundred $\mu$m (micron meters) in order to protect the CPU, thereby raising heat resistance still more. For this reason, the structure of the prior art shown in this drawing, consisting only of using heat discharging substrate 8 to release heat from the top face of package 11, does not afford a sufficient degree of heat discharge.

The same is true of the IC card detailed in the above mentioned Japanese laid-open patent publication number Hei 3-182397, wherein heat is dispersed from only one surface of the semiconductor element package. With this type of small semiconductor device, achieving a strategy for heat discharge is an important element in promoting greater efficiency and function.

Natural convection through a slit in the structure has the advantage of being a simple change that does not enlarge the device as a whole, but it provides only a low heat discharging effect. In addition, particularly with small items for everyday use such as IC cards, this method is not preferred because it lowers the dustproofing and waterproofing properties so important in the use of these products.

With surface mounting such as in the COB system, the structure wherein thermal via holes alone constitute a heat discharging route cannot be expected to produce a sufficient heat discharging effect. Indeed, if the number of thermal via holes is increased, the area of the semiconductor pattern of the inner layer is correspondingly decreased, so heat conducting efficiency naturally decreases.

When a semiconductor element is operated at low voltage in order to control the amount of heat arising from consumption of electric current, there is the danger of reducing the performance characteristics of the semiconductor element such as clock frequency and access time. This, in turn, decreases the efficiency and performance of the semiconductor device.

SUMMARY OF THE INVENTION

The semiconductor device of the invention takes into account the problems of the prior art mentioned above, and provides a superior heat discharging structure without enlarging the semiconductor device itself. Further, the semiconductor device does not unnecessarily lower the rated voltage of the semiconductor element. By making a heat discharging route with low heat resistance, the outside heat arising from the electronic parts is efficiently dispersed, thus decreasing the size and increasing the function of the semiconductor device.

The semiconductor device of the invention also provides a heat discharging structure suitable for small semiconductor devices, such as IC cards.

In the semiconductor device of the invention, electronic parts are mounted at a position on a substrate at which thermal via holes are located. Heat arising from the electronic parts is transmitted through the thermal via holes to a heat discharging element through a high heat conductive material which is placed as filling between the heat discharging element and the substrate. In this manner, the heat transmission distance is made short while the cross-sectional area is large, thus making it possible to obtain a heat discharging route with low heat resistance, making possible highly efficient discharge of heat. In particular, the invention may be applied to small semiconductor devices such as IC cards, making it possible to simultaneously decrease the size of the device and heighten its function.

The semiconductor device of the invention comprises a substrate on which are arranged thermal via holes in a desired position. Electronic parts are mounted where the thermal via holes are arranged on the substrate, and a heat discharging element is located on a side of the substrate opposite the side whereon the electronic parts are mounted. A high heat conductive material is installed between the heat discharging element and the substrate at the point at which the thermal via holes are arranged.

Thus, heat arising from the electronic parts is transmitted through the thermal via holes to the side of the substrate opposite the electronic parts mounting face. The heat is then transmitted from the substrate to the high heat conductive material, and from the high heat conductive material to the heat discharging element, and thus the heat is dispersed. This heat discharging route has little heat resistance and can discharge heat efficiently because the thermal via holes are formed of metal and have high heat conductivity, and because the transmission distance from the electronic parts mounting face to the heat discharging element is short and the cross-sectional area is large. In particular, in cases where bare chip electronic parts are surface mounted to the substrate with a bonding agent, heat transmission between the silicone and the metal is good, meaning a heat discharging route with smaller heat resistance can be obtained.

When an electrically nonconductive material is used as the high heat conductive material, the electronic parts are electrically insulated from the heat discharging element, so that even if the heat discharging element receives an electrical surge from outside, such as static electricity, it is not conducted to the electronic parts, thus protecting against destruction or faulty operation.

From the point of view of semiconductor device assembly operations, use of flexible and semifluid silicone rubber as the high heat conducting material is advantageous because it changes shape to accommodate the space between the substrate and the heat discharging element. Also, when it is in the shape of a sheet, it is easier to handle, thus enabling simplification of assembly procedures.

In addition, with the invention, the high heat conducting material can be laminated, interposing a metallic substrate between the substrate and the heat discharging element, so that even when the space between them is comparatively large, this can be accommodated and the abovementioned heat discharging route can be ensured.

In this case, when a metallic substrate is interposed and an electrically nonconductive material is used for the high heat conductive material, heat resistance can be kept low between the metal substrate and the heat discharging element, and the electronic parts can be protected from surges from the outside. Also, when the space between the substrate and the heat discharging element is large due to dual-face mounting, by forming a protruding part on the substrate-side of the heat discharging element, and by placing a high heat conductive material between the protruding part and the substrate, the abovementioned low-heat-resistance heat discharging route can be ensured in the same way, discharging heat from the back face of the substrate through the thermal via hole. At this point, if the substrate is fastened onto the protruding part by a screw, even if there is a shock from the outside, a narrow space can be preserved between the substrate and the protruding part, so fats and oils, such as heat-conducting grease, can be used as high heat conductive material.

In the case where the substrate is a multilayered substrate, thermal via holes can be formed so as to join with the conductor patterns on the inner layer of the substrate, forming a different heat discharging route. In this manner, part of the heat is transmitted from the thermal via holes through the inner layer of the substrate to the electronic parts and then to the outside. By wiring the signal lines of the electronic parts on the substrate surface and by making the ground layer or electric power supply layer on the inner layer of the substrate, this heat discharging route allows the signal line through holes to be eliminated from the area near the electronic parts of the substrate, leaving electric power supply or ground through holes. Therefore, the through holes for the electric power supply layer or ground layer are kept to a minimum, and heat can be discharged efficiently. In particular, when CPUs and ASICs are arranged closely on top of the substrate, their signal lines can be connected in a one-to-one ratio, so the signal line through holes from the vicinity of the high-heat-producing CPU can be completely eliminated.

In addition, in the case where the substrate is a multilayered substrate, a concave area may be formed on the substrate surface, exposing the ground layer of the substrate, and thermal via holes are formed in the concave area, while the electronic parts are attached by means of a bonding agent to the bottom face of the concave area exposed by the ground layer. Through this, the length of the thermal via hole is lessened, so the distance of heat transmission from the electronic parts to the heat discharging element is shortened, and more efficient heat discharging can be accomplished.

Because the side faces of the concave area also expose the substrate ground layer, by further filling the space between the electronic parts and the concave area with bonding agent, heat can be transmitted directly from the electronic parts to the substrate ground layer through the bonding agent. By combining multiple heat discharging routes in this manner, the heat discharging efficiency of the whole device is improved still more.

Because the semiconductor device of the present invention makes into the heat discharging element the metallic part forming the case accommodating the substrate, heat can be dispersed from the large-surface-area case directly into the atmosphere. Heat resistance is low, so more efficient heat discharge can be accomplished. Thus, even with small semiconductor devices, it becomes unnecessary to use the circulation fans and large heat sinks or heat pipes of the prior art, and a decrease in the size of the device and an increase in its function can be realized simultaneously. In addition, when concave and convex parts are formed together on the heat discharging element or case substrate and the opposite-side face, the heat discharging area can be greatly enlarged, with a corresponding increase in heat discharging effect.

With the invention, the case constitutes a box in the shape of a thin card comprising a frame and a set of upper and lower panels of metallic construction, wherein the substrate is arranged and accommodated between both panels and can be used as a so-called IC card. One of the panels disperses heat from the case as a heat discharging element. The IC card is extremely small and thin, and special heat discharging methods such as circulation fans and heat sinks cannot be installed inside. However, when constructed as in the present invention, a heat dissipation route with low heat resistance and high efficiency can be obtained. Through this, a higher-function IC card can be accomplished. In addition, by arranging high heat conductive material between the electronic parts and case on the electronic parts mounting side of the substrate, heat from the electronic parts is transmitted from both sides of the substrate to the case, and heat discharging efficiency is improved still more.

BRIEF DESCRIPTION OF THE DRAWINGS

The invention is described in detail with reference to the following drawings, wherein like numerals represent like elements, and wherein.

DETAILED DESCRIPTION OF PREFERRED EMBODIMENTS

Figure 1:
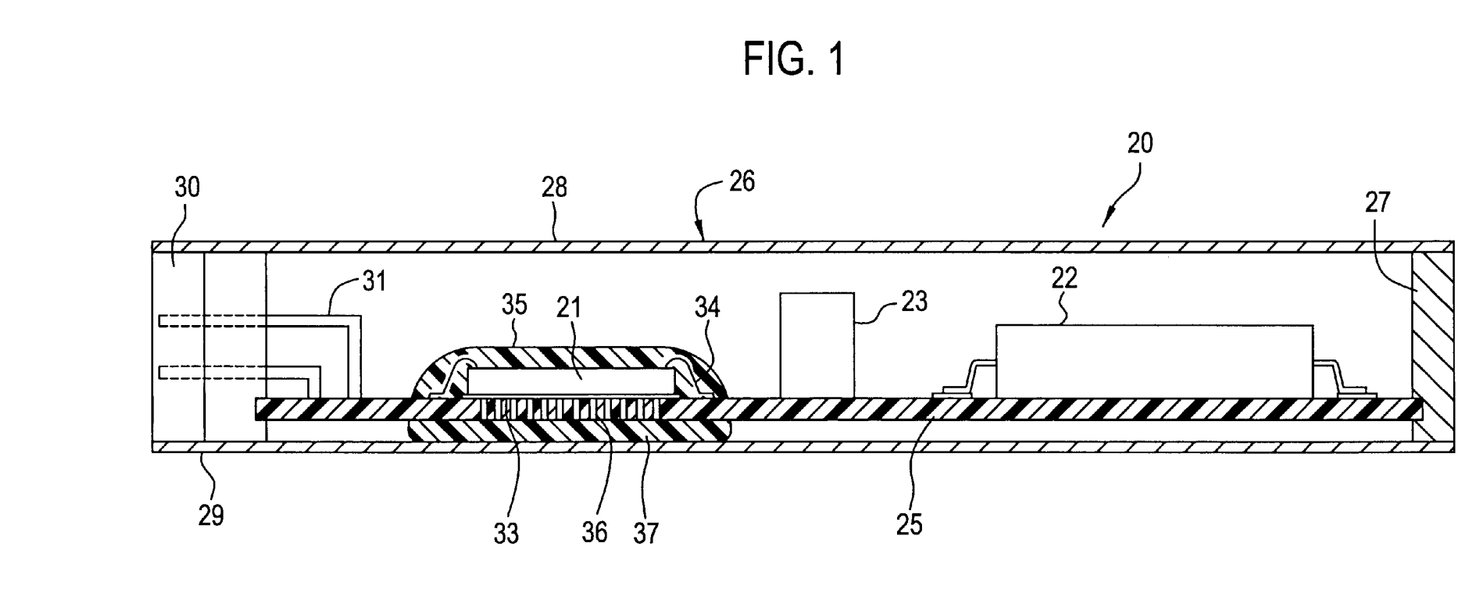
FIG. 1 is a cross-sectional drawing of an embodiment of an IC card shaped semiconductor device.
Figure 2:
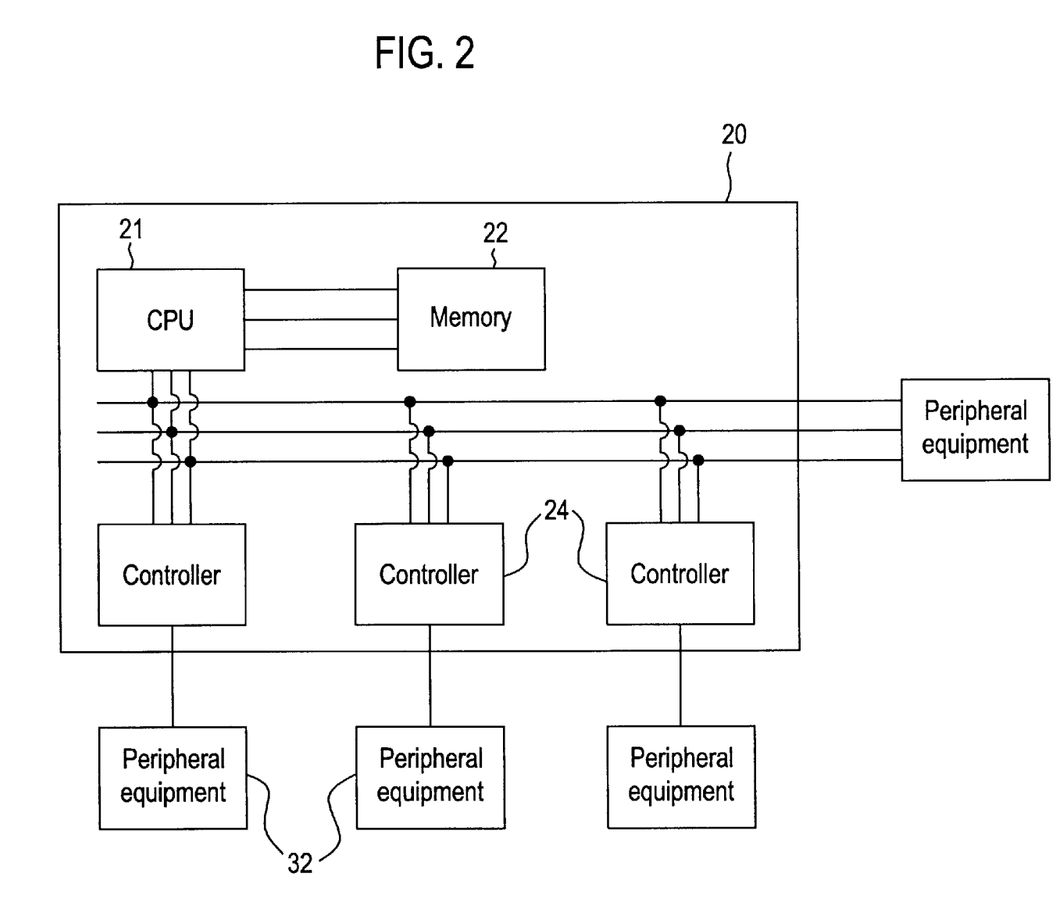
FIG. 2 is a functional block diagram of the semiconductor device of FIG. 1.

FIG. 1 shows a preferred embodiment of a semiconductor device 20 having a card shape nearly identical with a memory card or so-called IC card. The semiconductor device 20 includes a control circuit part of a computer, as shown in FIG. 2. A substrate 25 is loaded with electronic parts including central processing unit (CPU) 21, memory 22, passive element 23, and controllers 24. The semiconductor device 20 is housed within metal case 26. Metal case 26 comprises metallic frame 27, upper and lower panels 28 and 29, and connector 30, which is built onto one side of the frame, electrically connecting through terminal 31 to the circuit of substrate 25. Semiconductor device 20 is connected through connector 30, as shown in FIG. 2, to the various types of peripheral equipment 32 for input and output, such as a keyboard and a display device. By installing this type of reduced-size card-shaped semiconductor device into various types of information equipment, the overall size of the equipment can be reduced, and thus enhanced portability and higher function can be realized simultaneously.

In the semiconductor device of the present embodiment, CPU 21, with high electric power consumption and therefore a large amount of heat produced, is housed within the narrow space of card-shaped metal case 26. Therefore, to prevent impairment of its characteristics, a heat discharging structure is extremely important as a measure to deal with heat. CPU 21 in the present embodiment is not a resin-sealed package product as in FIG. 11, but a bare chip as clearly shown in FIG. 1, and is directly mounted on the surface of substrate 25 with silver paste 33 in a COB system. The electrodes of CPU 21 are connected by bonding wire 34 to the terminals on the substrate, and these are entirely sealed in mold resin 35. Also, in the mounting of CPU 21 to substrate 25, in addition to silver paste, an adhesive or wax-material with heat conductivity known in the prior art such as copper paste or solder may be used as a bonding agent.

Several thermal via holes 36 are formed in the substrate in the area where CPU 21 is mounted. Thermal via holes 36 are plated through holes, plated on their inner surface with metal and formed as holes through substrate 25, and can be easily made in the normal procedure for manufacturing substrates, without adding special procedures. Also, thermal via holes 36 may be made by filling the plated through holes with resin and then opening holes in them, or by filling the holes through substrate 25 with copper paste or other heat conductive material.

In the space between lower panel 29 and the bottom face of substrate 25, in the area where thermal via holes 36 are formed, highly heat-conductive filling material 37 is placed. In the present embodiment, the electric potential of thermal via holes 36 and the bottom face of substrate 25 is the same as that of the surface of the substrate, i.e. the CPU mounting face. Therefore, to protect CPU 21 from surges from the outside such as static electricity, it is preferable to use for filling material 37 an electrically nonconductive material to electrically insulate substrate 25 from metallic lower panel 29. Also, to simplify assembly of semiconductor device 20, flexible materials, materials which can easily change their shapes, and materials in the shape of a sheet are preferable. For example, semifluid silicone rubber, silicone resin, and heat-conductive grease are convenient as this type of material.

In semiconductor device 20 of the present embodiment, the heat arising from CPU 21 is discharged through the following three main routes. In the first route, heat is transmitted from the bottom face of CPU 21 through silver paste 33 and thermal via holes 36 to filling material 37 on the bottom face of substrate 25, and then from the filling material 37 to lower panel 29. The greater part of the heat transmitted to lower panel 29 is radiated directly to the atmosphere from the surface of the lower panel 29, while some of it is transmitted to the outside through frame 27 and connector 30. In the second route, heat is radiated from the top surface and side surfaces of CPU 21 through mold resin 35, and directly from its top face to the space inside metal case 26. In the third route, heat is transmitted from CPU 21 through bonding wire 34 to the wiring pattern of substrate 25, and from the wiring pattern to frame 27 and upper and lower panels 28 and 29.

The first route is a heat discharging route with extremely low heat resistance, because the heat transmission distance is comparatively short while the cross-sectional area is large, and because the silver paste and thermal via holes are metal and are excellent for heat conductivity, and because the space between the metallic face of silver paste 33 and the silicone face of bare chip CPU 21 has high heat conductivity. In contrast to this, the second and third routes are heat discharging routes of the prior art as explained above, and in comparison with the first route, heat resistance is rather large. Thus, in the present embodiment, the greater part of the heat arising form CPU 21 is efficiently discharged through the first route, obtaining an excellent heat discharging effect and controlling temperature rise within the device without using special heat discharging methods of the prior art such as heat discharging fins, heat sinks, and heat pipes. As a result, high function can be realized without interfering with a decrease in size.

Figure 3:
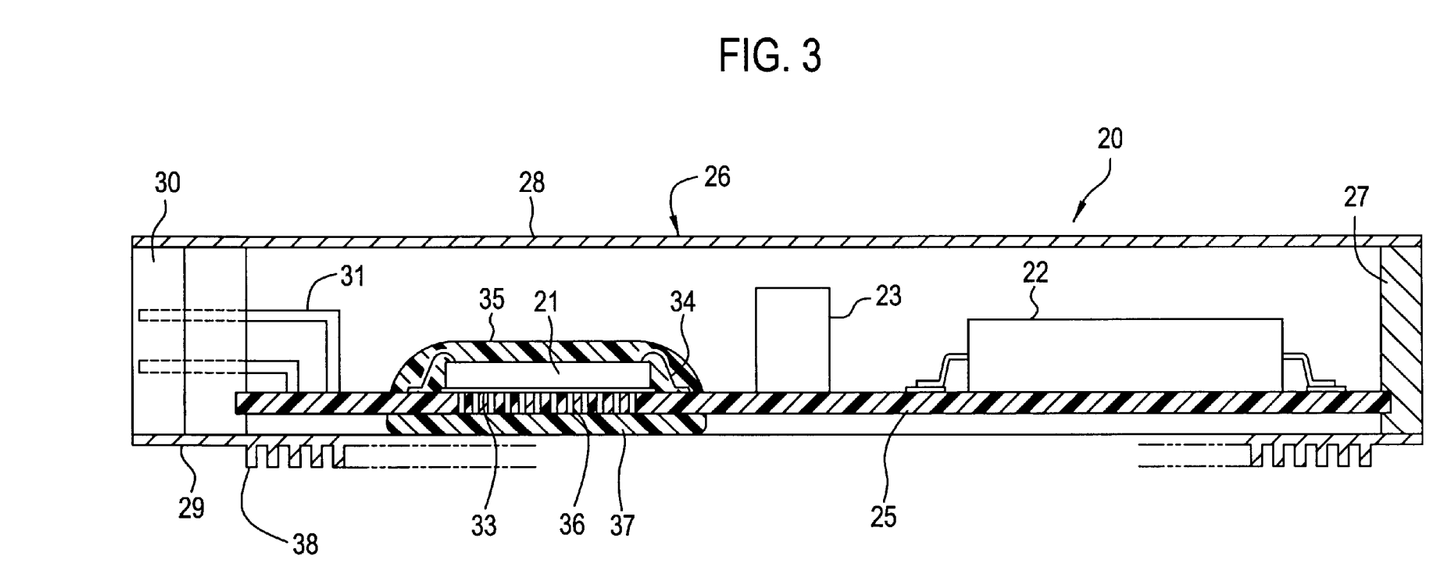
FIG. 3 is a cross-sectional drawing of a second embodiment of an IC card shaped semiconductor device.

FIG. 3 shows the second embodiment of the semiconductor device of the invention, which is the embodiment of FIG. 1 with variations added. The semiconductor device of the present embodiment differs from the first embodiment of FIG. 1 in that the outer surface of lower panel 29 is not even, but has substantially concave and convex parts 38, like short heat discharging fins, over nearly its whole surface. By making these substantially concave and convex parts 38 in the present embodiment, it is possible to enlarge the outer surface area of lower panel 29 by around three times that in FIG. 1. Through this, the heat discharging area of lower panel 29 in the first route can be enlarged greatly, and because of this, a corresponding increase in heat discharging effect can be obtained.

Lower panel 29 can be made in one piece with substantially concave and convex parts 38 by, for example, pressing, cutting, or diecasting metallic materials such as zinc, aluminum, or copper. Thus, in the assembly process for the case, no special installation procedure is needed for the heat discharging fins of the prior art, and, after assembly, there is no danger of the substantially convex and concave parts 38 detaching from lower panel 29 due to shock from the outside and damaging the heat discharging function. Also, in another embodiment, it is possible to form the substantially convex and concave parts in the shape of a wave, through the process of pressing the metal substrate.

Figure 4:
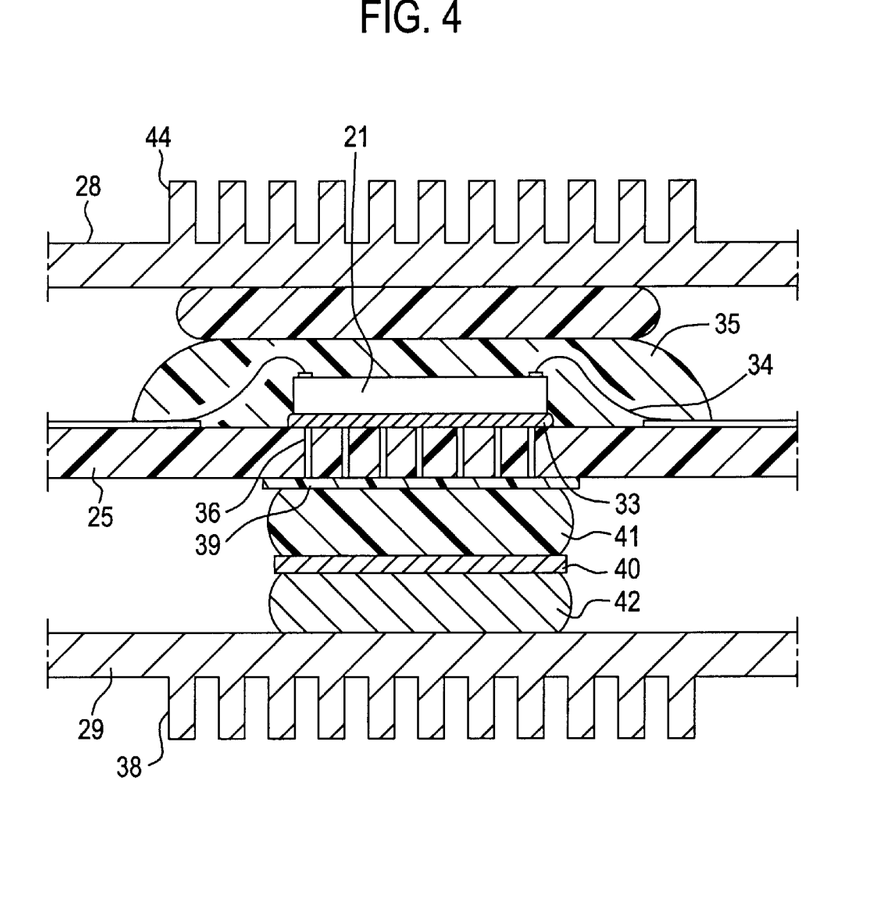
FIG. 4 is a cross-sectional drawing of a third embodiment.

In FIG. 4, the principal parts of the third embodiment of a semiconductor device of the invention are shown. The same as in the first and second embodiments, the CPU 21 bare chip is attached with silver paste 33 to the top face of substrate 25, in which are made thermal via holes 36. Polyimide resin film 39 is pasted onto the bottom face of substrate 25 to prevent leakage from the silver paste through thermal via hole 36, but this is not an absolutely essential element of the heat discharging structure of the present embodiment. Also, naturally, if the insides of thermal via holes 36 are filled beforehand with resin or the like, there is no need to use film 39.

Between film 39 or substrate 25 and lower panel 29, with convex and concave parts 38 made on it as in the second embodiment for good heat conductivity, high heat-conductivity filling material 41 and 42 are placed, with metal substrate 40 interposed between them. For metal substrate 40, a material with high heat conductivity, such as copper, zinc, or aluminum, is used. By laminating filling material with metal substrate 40 interposed in this way, even when the space between substrate 25 and lower panel 29 is large, the heat discharging route connecting them can be secured. Also, when the space is larger, it is possible in addition to laminate another metal substrate and filling material.

For upper filling material 41, as explained in relation to the filling material 37 in the embodiment in FIG. 1, it is preferable to use an electrically nonconductive material such as silicone rubber, silicone resin, or heat-conductive grease, to electrically insulate substrate 25 from lower panel 29 and protect CPU 21 from surges from the outside such as static electricity. In contrast to this, for lower filling material 42, solder, silver paste, copper paste or another material may be used, in addition to silicone rubber, silicone resin, heat-conductive grease or other adhesives, to promote conduction of heat to lower panel 29.

In the present embodiment, high heat conductivity filling material 43 is placed between upper panel 28 and mold resin 35, which seals CPU 21 and bonding wire 34. On the outer surface of upper panel 28, at least in the area near where filling material 43 makes contact, substantially concave and convex parts 44, like heat discharging fins, are made in one piece with upper panel 28, the same as with lower panel 29. For filling material 43, silicone rubber, silicone resin, heat-conductive grease, adhesive, solder, silver paste, copper paste or the like may be used. Like lower panel 29, upper panel 28 may be formed by methods such as pressing, cutting, or die casting a metal material such as zinc, aluminum, or copper.

The heat discharging routes of the present embodiment include, as in the first and second embodiments above, the first route from the bottom side of substrate 25 to the lower panel through thermal via holes 36, the second route of heat discharge directly to the space inside the metal case through mold resin 35, and the third route transmitting heat to substrate 25 through bonding wire 34, plus, in addition, a fourth route, transmitting heat from mold resin 35 through filling material 43 to upper panel 28. In the first route, heat transmission distance is longer compared to the first and second embodiments, but, because heat resistance is low, the greater part of the heat arising from CPU 21 can be efficiently discharged. Indeed, by adding the fourth heat discharging route, the device as a whole obtains a greater heat discharging effect.

Also, in another embodiment, the above-mentioned laminated structure between substrate 25 and lower part 29, consisting of filling material 41, metal substrate 40, and filling material 42, can also be used between upper panel 28 and substrate 25. In other words, in the space between substrate 25 and upper and lower panels 28 and 29, a heat discharging structure inverted from that in FIG. 4 can be adopted by interposing a metal substrate and laminating a filling material between mold resin 35 and lower panel 29. It is also possible to make laminated structures of metal substrates interposed into filling material between substrate 25 and each of both the upper and lower panels.

Figure 5:
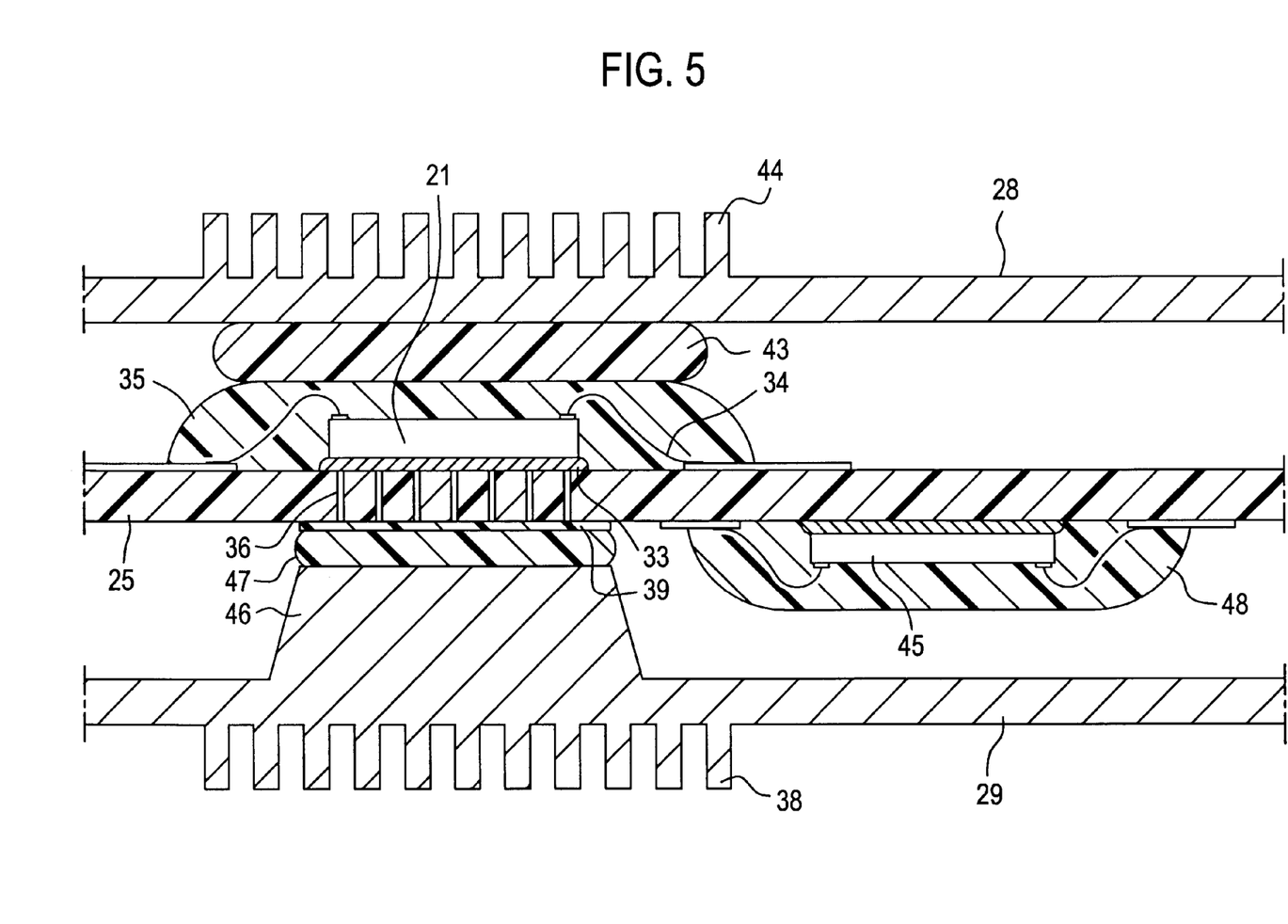
FIG. 5 is a cross-sectional drawing of a fourth embodiment.

In FIG. 5 is shown the fourth embodiment of the semiconductor device of the invention, which is the third embodiment of FIG. 4 with variations added. In the fourth embodiment, because substrate 25 is a dual-face mounted substrate with semiconductor part 45 mounted in a COB system on its bottom face, the space between the substrate 25 and lower panel 29 is comparatively large. For this reason, trapezoid-shaped protruding part 46 is made on the inner face of lower part 29, while between the upper surface of the trapezoid and the substrate is placed highly heat-conductive filling material 47, in which point the fourth embodiment differs from the third embodiment. For filling material 47, as in the case of the abovementioned first embodiment, an electrically nonconductive material such as silicone rubber is preferred.

Thus, in the first heat discharging route of the present embodiment, heat from CPU 21 is transmitted through silver paste 33 and thermal via holes 36, to filling material 47 to protruding part 46, i.e. directly to lower panel 29. Because the space between substrate 25 and lower panel 29 is large, the heat transmission distance is correspondingly longer, but, because protruding part 46 is formed in one piece with lower panel 29, heat resistance is low and heat transmission can be accomplished more efficiently than by interposing a filling material, as in the third embodiment, for a high heat discharging effect.

In another embodiment, with semiconductor part 45 mounted on the bottom face of substrate 25, by placing filling material between lower panel 29 and mold resin 48 which seals semiconductor part 45, and/or making thermal via holes in substrate 25 and placing filling material between it and upper panel 28, part of the heat arising from semiconductor part 45 can be similarly released from one or both of the upper and lower panels. Through this, the heat discharging effect of the semiconductor device as a whole can be improved still more.

Figure 6:
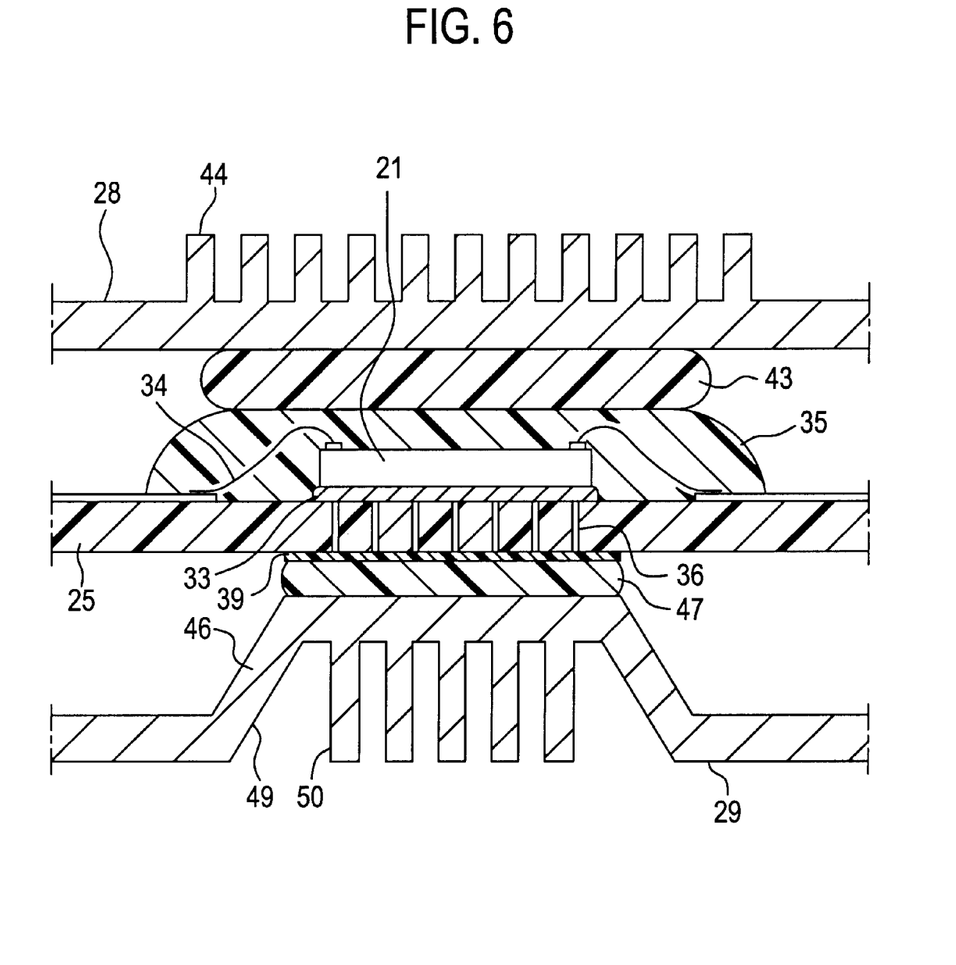
FIG. 6 is a cross-sectional drawing of a variation of FIG. 5.

FIG. 6 shows a variation on the fourth embodiment in FIG. 5. In this variation, depression 49 is made in the outer face of protruding part 46, while inside substantially convex and concave parts 50, similar to heat discharging fins, are made in one piece with it. Substantially convex and concave parts 50 are designed so that their ends are on an even plane with the lower face of lower panel 29, so as to increase the surface area of the metal case as much as possible without increasing its thickness. Thus, while the same device overall thickness is maintained, the excellent effects of the above-mentioned fourth embodiment are also maintained, allowing a high heat discharging effect to be obtained.

Figure 7:
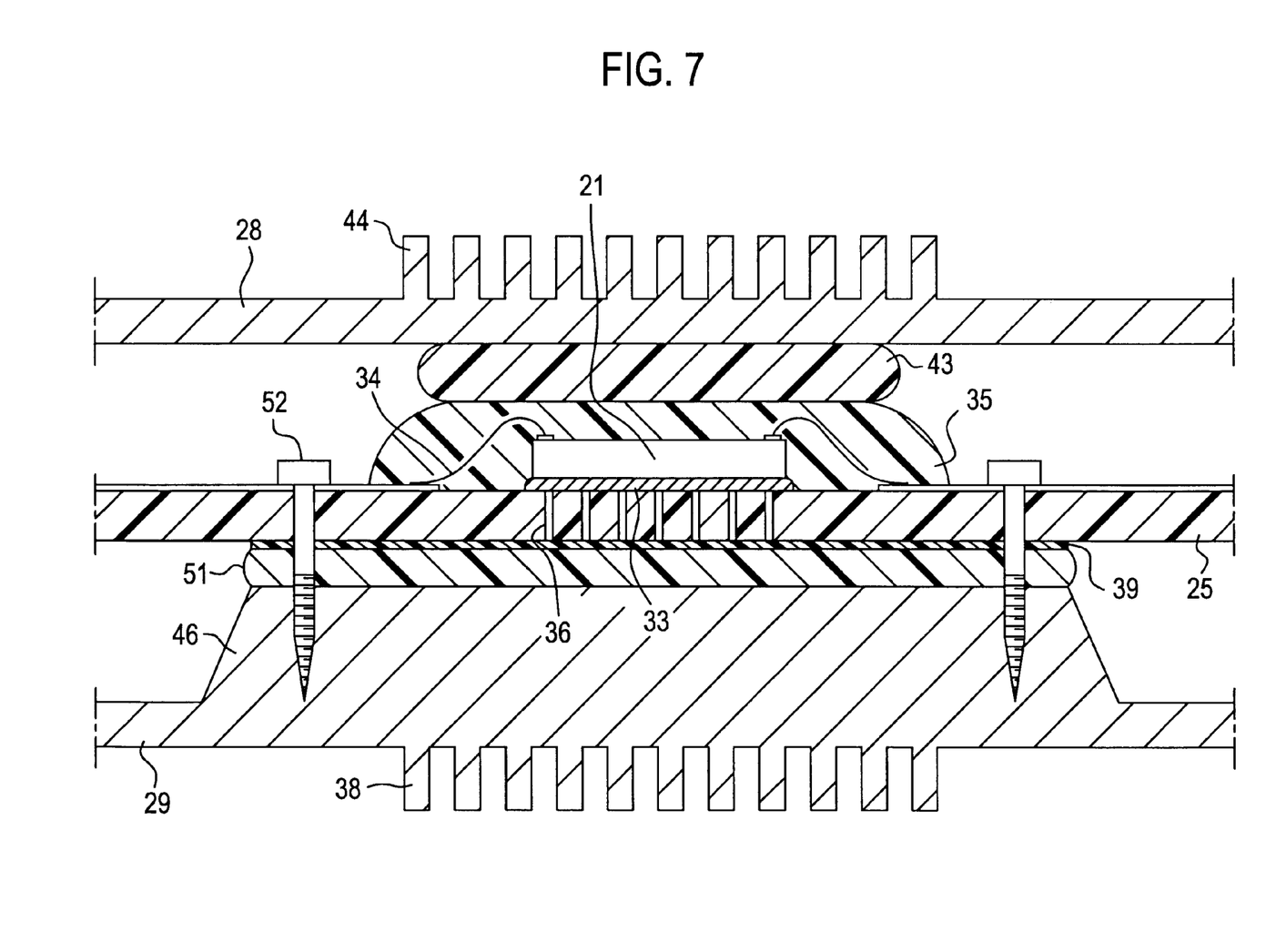
FIG. 7 is a cross-sectional drawing of another variation of FIG. 5.

FIG. 7 shows another variation on the fourth embodiment of FIG. 5. This embodiment differs from the fourth embodiment in that protruding part 46 is made large, while on the upper face of the protruding part, substrate 25 is fixed with screw 52, with filling material 51 interposed between substrate 25 and protruding part 46. Because of this, even if a semifluid material is used for filling material 51, there is no danger of having an interval between the substrate 25 and protruding part 46. Further, there will be no slippage of filling material 51 because of a shock from the outside, so it becomes easy to use a filling material such as a highly heat-conductive grease. Also, in the embodiment of FIG. 7, because of the small space between the bottom face of substrate 25 and the upper face of protruding part 46, it is possible to use only one of either film 39 or filling material 51 rather than both. In this case, the heat transmission distance becomes even shorter and heat conduction is accomplished efficiently, so the heat discharging effect is heightened.

Figure 8:
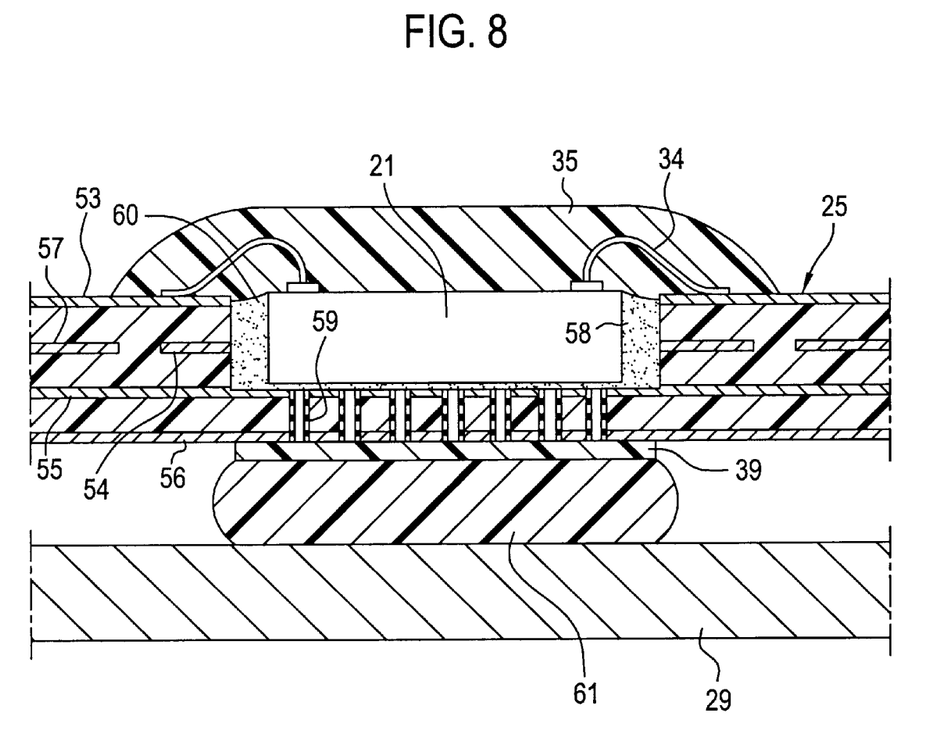
FIG. 8 is a cross-sectional drawing of a fifth embodiment.

In FIG. 8 is shown the fifth embodiment of the semiconductor device of the present invention. In the present embodiment, substrate 25 is a multilayered substrate, and onto its top and bottom faces and inner layer are built ground layers 53–56 and electric power supply layer 57. On the top face of substrate 25 concave area 58 is formed, to mount CPU 21, so as to expose inner layer ground layer 55. On the side face of concave area 58 are exposed cross-sections of substrate top face ground layer 53 and inner layer ground layer 54. On the bottom face of concave area 58 are formed several thermal via holes 59, as in each embodiment mentioned above. The thermal via holes are blocked by polyimide resin film 39 pasted onto the bottom face of substrate 25.

Bare chip CPU 21 is attached directly to ground layer 55 on the bottom face of concave area 58 with bonding agent 60, while it is electrically connected to the terminals on the top face of substrate 25 with bonding wire 34. For bonding agent 60, silver paste, copper paste, solder or other high heat-conductivity wax materials may be used. Bonding agent 60 is placed in the space between the outer circumference of CPU 21 and the side face of concave area 58 so as to fill it completely. The top of the CPU and bonding wire is covered with bonding agent just as in the prior art. Because of this, the four side faces and bottom face, but not the top face, of CPU 21 are connected through bonding agent 60 to each ground layer or, through bonding agent 60 and substrate 25 to each electric power supply layer of the substrate so as to make possible heat transmission with low heat resistance. Also, filling agent 61 is placed between lower panel 29 and the bottom face of the substrate, on which film 39 is pasted. For filling material 61, it is convenient if it is electrically nonconductive, as in the first embodiment mentioned above.

In the present embodiment, the heat arising from CPU 21 is discharged through the first route, wherein it is transmitted from bonding agent 60 and ground layer 56 through thermal via holes 59 and filling material 61 to lower panel 29, the second route wherein it is transmitted through bonding wire 34 to the wiring pattern of substrate 25, and in addition a third route, wherein it is transmitted from each face of CPU 21, except the upper face, through bonding agent 60 to the ground layers and power supply layer of the substrate. In the first route of the present embodiment, thermal via holes 59 are shorter than the thickness of substrate 25, so the heat transmission distance is shorter compared to each embodiment mentioned above, and heat resistance is lower. In addition, in the third route, heat is transmitted more efficiently than through bonding wire 34 in the second route, so the heat discharging effect as a whole can be improved still more.

Figure 9A:
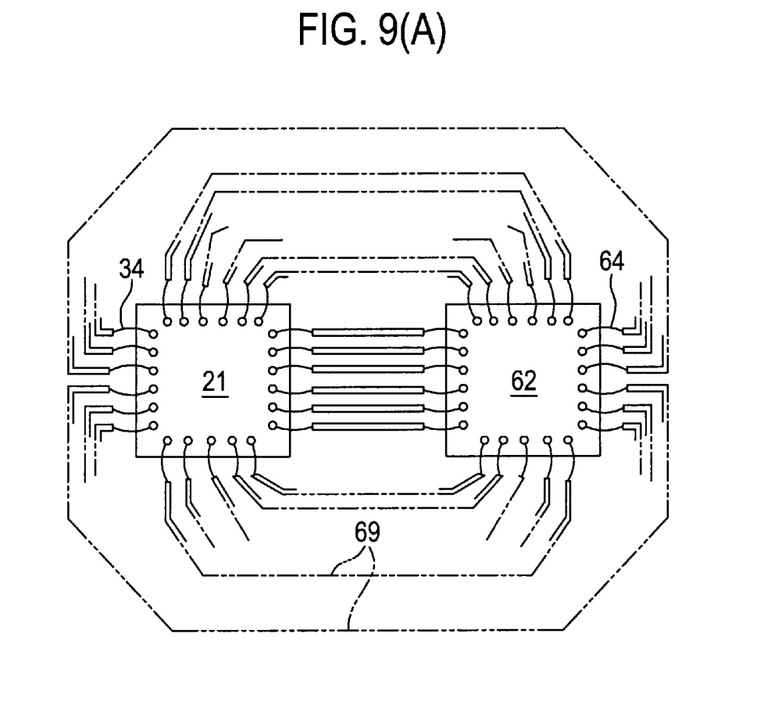
FIG. 9A is a top view of a sixth embodiment.
Figure 9B:
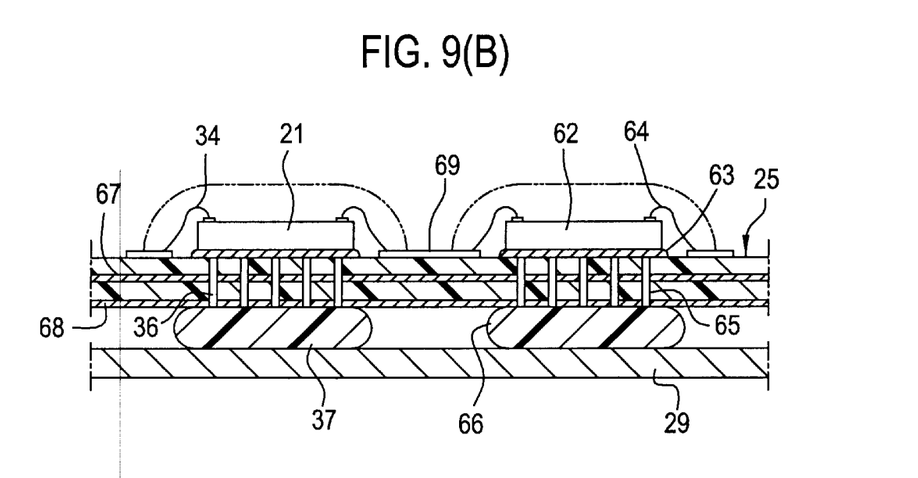
FIG. 9B is a cross-sectional drawing of the embodiment of FIG. 9A.

In FIG. 9 is shown the sixth embodiment of the semiconductor device of the present invention. In the present embodiment, Application Specific Integrated Circuit (ASIC) 62, which is connected to CPU 21, is arranged so as to be near the CPU 21. CPU 21 is surface-mounted in the COB system just as in the first embodiment, while it is connected to lower panel 29 so as to make heat transmission possible through thermal via holes 36 and filling material 37. ASIC 62 is attached to the surface of substrate 25 with silver paste 63 in the COB system like the CPU, while it is connected with bonding wire 64 to the wiring pattern on the substrate. Substrate 25 has several thermal via holes 65 formed in it on the bottom side of ASIC 62, and between the substrate and lower panel 29 is placed highly heat-conductive filling material 66. Substrate 25 is a multilayered substrate, and has ground layers 67 and 68 and an electric power supply layer built into its inner layers and bottom face.

As clearly shown in FIG. 9A, signal line 69 of CPU 21 is wired on the surface of substrate 25 and connected to ASIC 62 in a one-to-one ratio. Because of this, on substrate 25 are formed a bare minimum of via holes consisting of via holes to connect with the ground layer or electric power supply layer, eliminating all or part of the signal line via holes from the area near CPU 21. Thus, in the ground layer and electric power supply layer, the number of via holes passing through the level surface is smaller than in the prior art, and a larger area and connected level surface can be secured than in the prior art, so heat is more efficiently transmitted through the ground layer and electric power supply layer. In the present embodiment, in addition to the first route wherein heat is discharged through thermal via holes 36 and 65 to lower panel 29, heat transmission efficiency is improved through the heat discharging route wherein heat is transmitted from bonding wires 34 and 64 and thermal via holes 36 and 65 to the ground layer and electric power supply layer, so the heat discharging effect for the device as a whole is improved.

A detailed explanation of some preferred embodiments of the invention has been given, but the invention may be embodied with many different changes and variations on the abovementioned embodiments while falling within the scope of the claims. For example, the substrate of the fifth embodiment shown in FIG. 8 may be used as the substrate for each of the other embodiments, thus allowing for an even greater heat discharging effect. Also, each of the embodiments above has been explained mainly in terms of IC cards, but it can be applied likewise to semiconductor devices of various applications and functions, such as in small notebook type computers or electronic notebooks. In addition, explanations have been centered around heat discharging routes for CPUs as electronic parts which produce large amounts of heat, but they may be applied likewise to other semiconductor parts or electronic parts which produce heat.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A semiconductor device, comprising;
   a substrate including a plurality of layers, an inner portion having at least one inner layer, a concave area exposing an inner ground layer of the substrate, a first side and a second side opposing the first side;
   a plurality of vacant thermal via holes formed in the inner ground layer of the substrate, the thermal via holes intersecting a conductor pattern of at least one layer of the substrate;
   an electronic component mounted over the thermal via holes on the first side of the substrate;
   a bonding agent attaching the electronic component to a surface of the inner ground layer;
   a heat discharging element disposed on the second side of the substrate; and
   a high heat conductive material located between the heat discharging element and the substrate and adjacent the thermal via holes.

2. The semiconductor device of claim 1, wherein the electronic component comprises a semiconductor chip that is surface-mounted on the substrate using a bonding agent.

3. The semiconductor device of claim 1, wherein the high heat conductive material is an electrical insulator.

4. The semiconductor device of claim 3, wherein the high heat conductive material comprises a semi-fluid silicone rubber.

5. The semiconductor device of claim 1, wherein the high heat conductive material is formed in the shape of a sheet.

6. The semiconductor device of claim 1, wherein the high heat conductive material is laminated to opposite sides of a metallic substrate.

7. The semiconductor device of claim 6, wherein the high heat conductive material is an electrical insulator.

8. The semiconductor device of claim 1, wherein the heat discharging element comprises an integrally formed protruding part located adjacent the substrate, and the high heat conductive material is located between the protruding part and the substrate.

9. The semiconductor device of claim 8, wherein the substrate is attached to the protruding part of the heat discharging element.

10. The semiconductor device of claim 1, wherein signal lines of the electronic component are attached to the first side of the substrate, and at least one of a ground layer and an electric power supply layer are installed in the inner portion, the at least one of the ground layer and the electric power supply layer forming at least one layer of the inner portion.

11. The semiconductor device of claim 10, wherein the electronic component comprises a CPU, and an ASIC mounted on the first side of the substrate, and signal lines that connect the CPU to the ASIC.

12. The semiconductor device of claim 1, wherein the bonding agent is between the electronic component and the substrate.

13. The semiconductor device of claim 1, wherein the heat discharging element is a metallic art that forms a portion of a case for the substrate.

14. The semiconductor device of claim 1, wherein the heat discharging element has integrally formed concave and convex areas on a surface of the heat discharging element opposite the substrate.

15. The semiconductor device of claim 13, wherein the case comprises a box in the shape of a thin card, the box comprising a frame and a set of metallic upper and lower panels surrounding the substrate, and the heat discharging element forming one of the upper and lower panels.

16. The semiconductor device of claim 13, wherein the high heat conductive material is located between the electronic component and the case on the first side of the substrate.

17. The semiconductor device of claim 1, wherein an internal circumferential surface of the thermal via holes is metal plated, and the metal plated thermal via holes passing through the substrate.

18. The semiconductor apparatus of claim 3, wherein the high heat conductive material is flexible.

19. A semiconductor device, comprising:
   a substrate having a first side and a second side opposing the first side;
   a plurality of vacant thermal via holes formed in the substrate;
   an electronic component mounted over the thermal via holes on the first side of the substrate;
   a heat discharging element disposed on the second side of the substrate;
   a metallic substrate disposed between the substrate and the heat discharging element; and
   a high heat conductive material laminated to opposite sides of the metallic substrate, the high heat conductive material being located (i) between the substrate and the metallic substrate and adjacent the thermal via holes, and (ii) between the metallic substrate and the heat discharging element.

20. The semiconductor device of claim 19, wherein the electronic component comprises a semiconductor chip that is surface-mounted on the substrate using a bonding agent.

21. The semiconductor device of claim 19, wherein the high heat conductive material is an electrical insulator.

22. The semiconductor device of claim 21, wherein the high heat conductive material comprises a semi-fluid silicone rubber.

23. The semiconductor device of claim 19, wherein the high heat conductive material is formed in the shape of a sheet.

24. The semiconductor device of claim 19, wherein the heat discharging element comprises an integrally formed protruding part located adjacent the substrate, and the high heat conductive material is located between the protruding part and the substrate.

25. The semiconductor device of claim 24, wherein the substrate is attached to the protruding part of the beat discharging element.

26. The semiconductor device of claim 19, wherein the substrate comprises multiple layers and an inner portion having at least one inner layer, and the thermal via holes intersect a conductor pattern of at least one inner layer.

27. The semiconductor device of claim 26, wherein signal lines of the electronic component are attached to the first side of the substrate, at least one of a ground layer and an electric power supply layer are installed in the inner portion, the at least one of the ground layer and the electric power supply layer forming at least one layer of the inner portion.

28. The semiconductor device of claim 27, wherein the electric component comprises a CPU, an ASIC mounted on the first side of the substrate, and signal lines connecting the CPU to the ASIC.

29. The semiconductor device of claim 19, wherein the heat discharging element is a metallic part that forms a portion of a case for the substrate.

30. The semiconductor device of claim 19, wherein the heat discharging element includes integrally formed concave and convex areas on a surface of the heat discharging element opposite the substrate.

31. The semiconductor device of claim 29, wherein the case comprises a box in the shape of a thin card, the box including a frame and a set of metallic upper and lower panels surrounding the substrate, and the heat discharging element forms one of the upper and lower panels.

32. The semiconductor device of claim 29, further comprising high heat conductive material located between the electronic component and the case on the first surface of the substrate.

33. The semiconductor device of claim 19, wherein an internal circumferential surface of the thermal via holes is metal plated, and the metal plated thermal via holes pass through the substrate.

34. The semiconductor apparatus of claim 21, wherein the high heat conductive material is flexible.

35. A semiconductor device, comprising:
   a substrate including a first side, a second side opposing the first side, multiple layers, at least one layer being a ground layer disposed inside a concave area at the first side;
   a plurality of vacant thermal via holes formed in the substrate and being electrically connected to the ground layer;
   an electronic component mounted on the ground layer inside of the concave area of the substrate and over the thermal via holes;
   a heat discharging element disposed on the second side of the substrate, the heat discharging element including a protruding part; and
   a high heat conductive material located between the heat discharging element and the substrate and adjacent the thermal via holes.

36. The semiconductor device of claim 35, wherein a portion of the ground layer is positioned in a side surface of the concave area.

37. A semiconductor device, comprising:
   a substrate having a first side and a second side opposing the first side;
   a plurality of vacant thermal via holes formed in the substrate;
   a semiconductor chip surface-mounted on the first side of the substrate over the thermal via holes by a bonding agent, the semiconductor chip being sealed by a resin having a surface;
   a first heat discharging element disposed on the first side of the substrate;
   a second heat discharging element disposed on the second side of the substrate; and
   a high heat conductive material located (i) between the second heat discharging element and the substrate and adjacent the thermal via holes, and (ii) between the surface of the resin and the first heat discharging element.

38. The semiconductor device of claim 37, wherein the bonding agent is silver paste.

39. The semiconductor device of claim 37, wherein the semiconductor chip is a CPU.

40. A semiconductor device, comprising:
   a substrate including a first side and a second side opposing the first side;
   a plurality of vacant thermal via holes formed in the substrate;
   a first electronic component mounted over the thermal via holes on the first surface of the substrate;
   a second electronic component mounted on the second side of the substrate;
   a heat discharging element disposed on the second side of the substrate, the heat discharging element comprises an integrally formed protruding part on the second side of the substrate; and
   a high heat conductive material connecting the protruding part of the heat discharging element and the substrate and being located adjacent the thermal via holes.

41. The semiconductor device of claim 40, wherein the protruding part is positioned substantially facing the first electronic component mounted on the first side of the substrate.

42. A semiconductor device, comprising:
   a substrate including first side and a second side opposing the first side;
   a plurality of thermal via holes formed in the substrate, the thermal via holes being vacant;
   a first electronic component mounted over the thermal via holes on the first surface of the substrate;
   a second electronic component mounted on the second side of the substrate;
   a heat discharging element disposed on the second side of the substrate, the heat discharging element including an integrally formed protruding part attached to the substrate, a depression on a side of the heat discharging element facing away from the second side of the substrate, and a heat radiating fin integrally formed in the depression; and
   a high heat conductive material connecting the protruding part of the heat discharging element and the substrate and being located adjacent the thermal via holes.

43. The semiconductor device of claim 42, wherein a distal end of the heat radiating fin and a surface of the heat discharging element are disposed in a common plane.

* * * * *